(12) United States Patent
Liu et al.

(10) Patent No.: US 7,759,734 B2
(45) Date of Patent: Jul. 20, 2010

(54) SEMICONDUCTOR DEVICE

(75) Inventors: Yuh-Turng Liu, Hsinchu (TW);
Shyan-Yhu Wang, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 309 days.

(21) Appl. No.: 12/044,615

(22) Filed: Mar. 7, 2008

(65) Prior Publication Data

US 2009/0224336 A1 Sep. 10, 2009

(51) Int. Cl.
*H01L 29/76* (2006.01)
*H01L 23/58* (2006.01)
*H01L 29/94* (2006.01)

(52) U.S. Cl. .................. 257/343; 257/127; 257/170; 257/341; 257/355; 257/401; 257/409; 257/481; 257/E29.066; 257/E29.132; 257/E29.133; 257/E29.266

(58) Field of Classification Search .................. 257/127, 257/170, 355, 401, 481, 341, E27.06, 343, 257/409, E29.066, E29.132, E29.133, E29.266
See application file for complete search history.

(56) References Cited

U.S. PATENT DOCUMENTS

| 5,028,981 | A | 7/1991 | Eguchi | |
|---|---|---|---|---|
| 6,175,132 | B1 | 1/2001 | Sato | |
| 6,833,586 | B2 * | 12/2004 | Tsuchiko | 257/343 |
| 6,998,653 | B2 | 2/2006 | Higuchi | |
| 2007/0018258 | A1 * | 1/2007 | Chen et al. | 257/409 |
| 2007/0187782 | A1 * | 8/2007 | Kato et al. | 257/409 |

* cited by examiner

*Primary Examiner*—Long K Tran
(74) *Attorney, Agent, or Firm*—J.C. Patents (57) ABSTRACT

A semiconductor device including a plurality of doped regions, a metal layer and a polysilicon layer is provided. The doped regions are disposed in a substrate. The metal layer includes a plurality of metal line patterns. The polysilicon layer disposed between the substrate and the metal layer includes a gate pattern and at least one guard ring pattern. The at least one guard ring pattern connects to the gate pattern and surrounds at least one of the metal line patterns. One of the metal line patterns connects to the gate pattern. The others of the metal line patterns connect to one of the doped regions in the substrate.

10 Claims, 8 Drawing Sheets

SEMICONDUCTOR DEVICE

BACKGROUND OF THE INVENTION

1. Field of Invention

The present invention relates to an integrated circuit, and more particularly to a semiconductor device.

2. Description of Related Art

In the semiconductor manufacturing process, a metal interconnect layer is used to electronically couple one device to another device. In general, a dielectric layer is formed as electronic isolation after a semiconductor device is formed, and then a metal interconnect layer including a metal layer and a plurality of contact plugs are formed. For a general device, in order for the subsequent patterning process to be more accurate, a thicker dielectric layer is deposited and then a planarization process is performed thereon. However, for some special devices, the thickness of the dielectric layer has to be thin enough in order to reduce the distance between a device and a metal layer to meet certain special requirements. The dielectric layer is so thin that a planarization process cannot be performed thereon. Ultimately, the rough topography of the un-planarized dielectric layer generates some problems.

Figure 1:
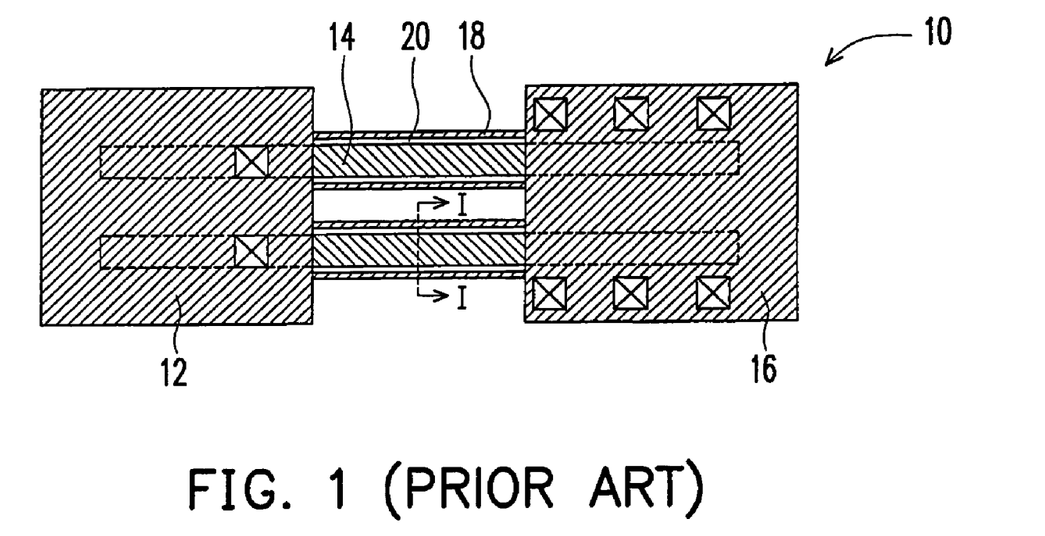
FIG. 1 is a schematic top view illustrating a conventional power MOS device.
Figure 1A:
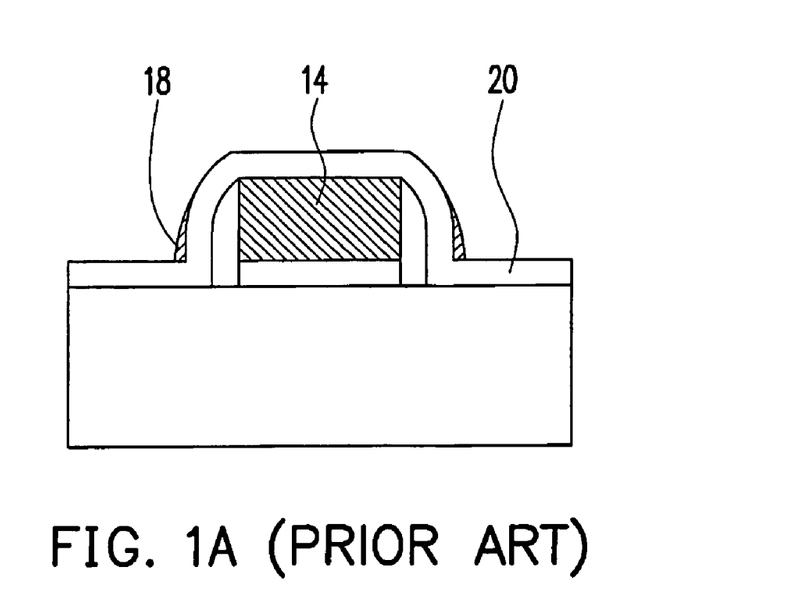
FIG. 1A is a schematic cross-sectional view taken along the line I-I of FIG. 1.

FIG. 1 is a schematic top view illustrating a conventional power MOS (metal-oxide-semiconductor) device. FIG. 1A is a schematic cross-sectional view taken along the line I-I of FIG. 1.

Referring to FIGS. 1 and 1A, in the manufacturing process of the power MOS device 10, in order to reduce the thickness of the dielectric layer, the conformal and un-planarized dielectric layer 20 is applied to increase the parasitic capacity between the gate metal pattern 12 and the gate pattern 14; and thus the sustainable load feedback voltage is increased. After the un-planarized dielectric layer 20 is formed, in order to increase the current, the subsequent metal layer used to form the gate metal pattern 12 and the source metal pattern 16 is usually very thick. Due to the very thick metal layer and the rough topography over the substrate, the process window becomes very narrow when the photolithography-and-etching process is performed on the metal layer to form the gate metal pattern 12 and the source metal pattern 16. After the etching process, a portion of the metal 18 (i.e. metal residue) remains on the dielectric layer 20 around the sidewall of the gate pattern 14 and a metal bridge issue is resulted.

SUMMARY OF THE INVENTION

The present invention provides a semiconductor device to solve the metal bridge issue caused by metal residues when an un-planarized dielectric layer is applied.

The present invention provides a semiconductor device. The semiconductor device includes a plurality of doped regions, a metal layer and a polysilicon layer. The doped regions are disposed in a substrate. The metal layer includes a plurality of metal line patterns. The polysilicon layer disposed between the substrate and the metal layer includes a gate pattern and at least one guard ring pattern. The at least one guard ring pattern connects to the gate pattern and surrounds at least one of the metal line patterns. One of the metal line patterns connects to the gate pattern. The others of the metal line patterns connect to one of the doped regions in the substrate.

According to an embodiment of the present invention, the doped regions may include a source doped region, a drain doped region or both.

According to an embodiment of the present invention, the number of the metal line patterns is N, the number of the guard ring patterns is N−1, the N−1 guard ring patterns surround the N−1 metal line patterns out of the N metal line patterns respectively, and N is an integral number larger than 1.

According to an embodiment of the present invention, the number of the metal line patterns is N, the number of the metal line patterns is N, the N guard ring patterns surround the N metal line patterns respectively, and N is an integral number larger than 1.

According to an embodiment of the present invention, the semiconductor device also includes an un-planarized dielectric layer disposed between the metal layer and the polysilicon layer.

According to an embodiment of the present invention, the guard ring pattern forms a closed loop with the gate pattern.

According to an embodiment of the present invention, the semiconductor device may include a MOS device.

According to an embodiment of the present invention, the semiconductor device may include a power MOS device.

The semiconductor device according to the present invention can solve the metal bridge issue caused by metal residues when an un-planarized dielectric layer is applied.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 2A, 2B, 2C and 2D are schematic top views illustrating a semiconductor device according to an embodiment of this invention.

Figure 2A:
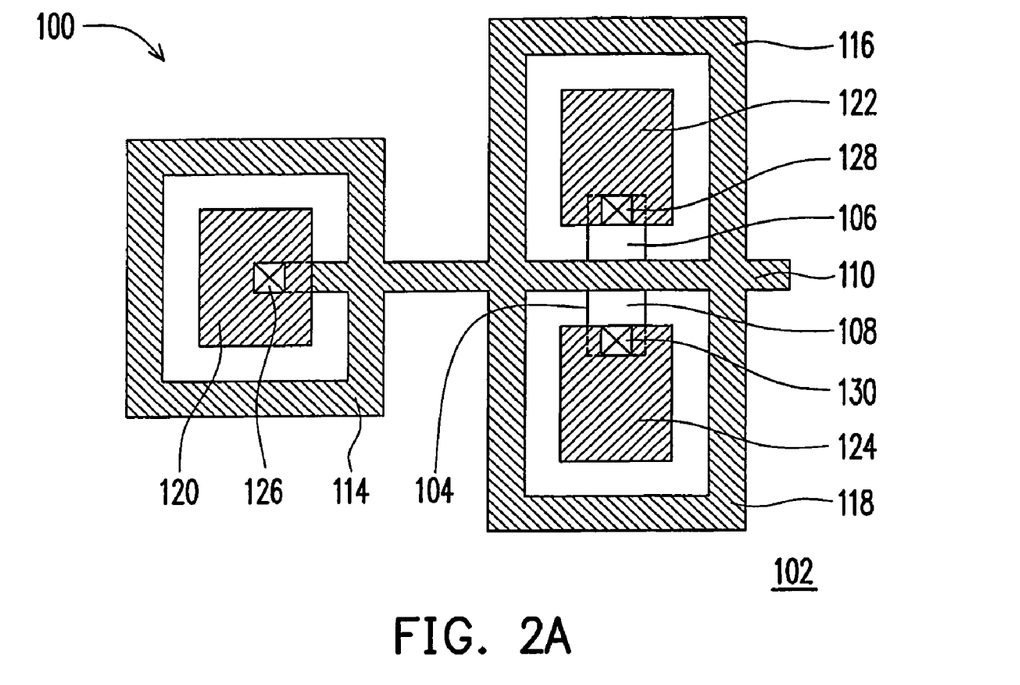
FIGS. 2A, 2B, 2C and 2D are schematic top views illustrating a semiconductor device according to an embodiment of this invention.
Figure 2B:
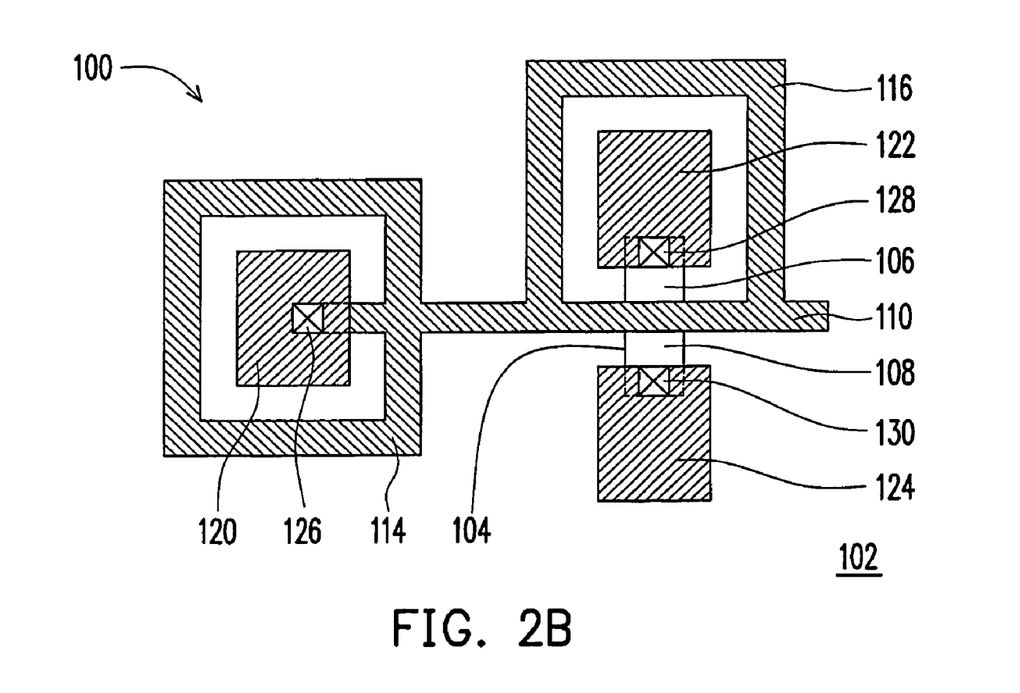
Figure 2C:
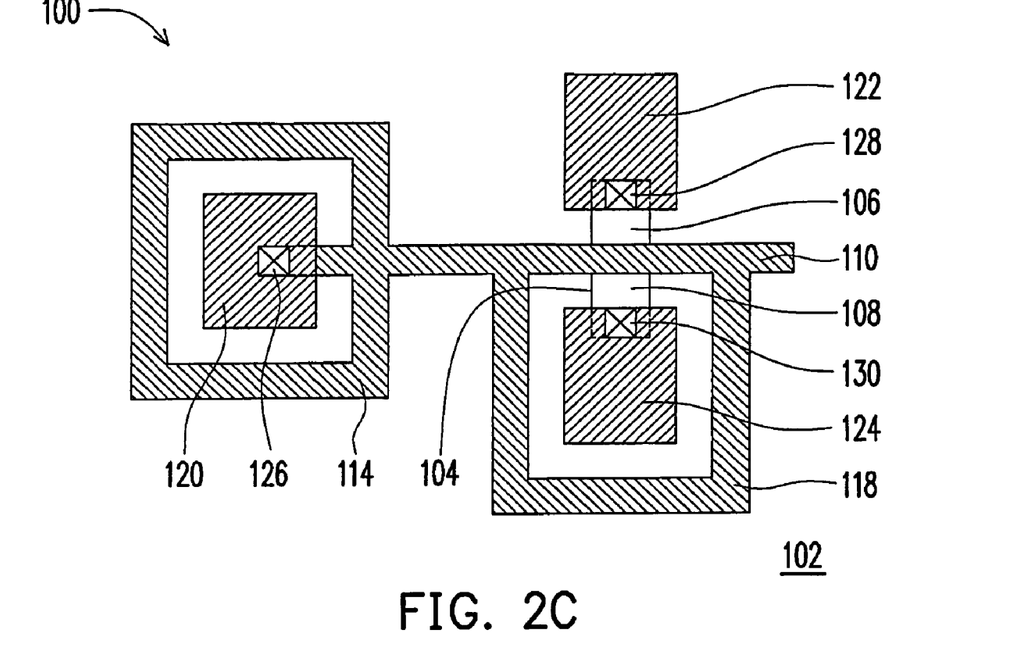
Figure 2D:
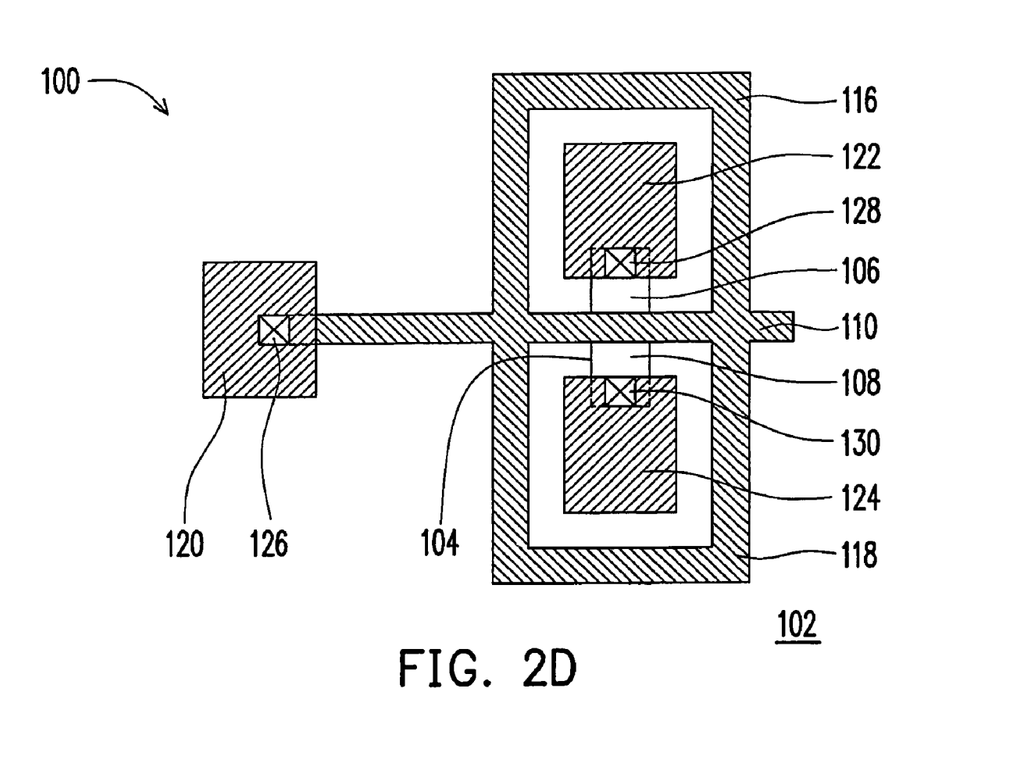

Referring to FIG. 2A, a semiconductor device 100 according to this invention is formed on a substrate 102. An area of the substrate 102 is defined into an active area 104. The semiconductor device 100 has a plurality of electrode patterns 106, 108 and 110. The electrode pattern 110 is disposed on the active area 104 of the substrate 102 and extends to the isolation structure (not shown) outside the active area 104. The electrode patterns 106 and 108 are disposed at two sides of the active area 104. For example, in a MOS device, the electrode patterns 106 and 108 are doped regions such as source and drain doped regions respectively, and the electrode pattern 110 is a gate pattern.

The electrode pattern 110 and the substrate 102 are covered by an un-planarized dielectric layer (not shown) formed conformally over the substrate 102. The thickness of the dielectric layer ranges from 1000 to 300 angstroms, for example. The material of the dielectric layer is silicon oxide, for example. The method of forming the dielectric layer is a CVD (chemical vapor deposition) process, for example.

The interconnect layer on the dielectric layer includes a plurality of interconnect patterns 120, 122 and 124. The interconnect pattern 120 connects to the electrode pattern 110 via a contact plug 126. The interconnect pattern 122 connects to the electrode pattern 106 via a contact plug 128. The interconnect pattern 124 connects to the electrode pattern 108 via a contact plug 130. The interconnect layer may be a metal layer including aluminum, cupper, AlCu or AlSiCu. When the electrode pattern 110 is a gate pattern, the interconnect pattern 120 is a gate metal pattern. When the electrode pattern 106 is a source doped region, the interconnect pattern 122 is a source metal pattern. When the electrode pattern 108 is a drain doped region, the interconnect pattern is a drain metal pattern.

In the present invention, the semiconductor device 100 also includes guard ring patterns 114, 116 and 118 respectively connecting to the electrode pattern 110. The shapes or patterns of the guard ring patterns 114, 116 and 118 are not limited, as long as the guard ring patterns 114, 116 and 118 can constitute a closed loop with the electrode pattern 110 respectively. In this embodiment, one closed loop is formed with the guard ring pattern 114 and the electrode pattern 110 surrounding the interconnect pattern 120. Another closed loop is formed with the guard ring pattern 116 and the electrode pattern 110 surrounding the interconnect pattern 122. The other closed loop is formed with the guard ring pattern 118 and the electrode pattern 110 surrounding the interconnect pattern 124. The guard ring patterns 114, 116 and 118 and the electrode pattern 110 are formed from the same conductive layer during a patterning process. The material of the conductive layer is polysilicon or polycide, for example. In the MOS device manufacturing process, the method of forming the guard ring patterns 114, 116 and 118 and the electrode pattern 110 is first to form a gate dielectric layer and a doped polysilicon layer on the substrate 102, and perform the same photolithography-and-etching process to simultaneously form the guard ring patterns 114, 116 and 118 and the virtual gate dielectric patterns (not shown) thereunder, as well as the electrode pattern 110 and the gate dielectric pattern (not shown) thereunder.

The guard ring patterns 114, 116 and 118 connect to the electrode pattern 110 and form closed loops respectively, and thus no metal bridge issue is observed even though metal residues remain when the interconnect patterns 120, 122 and 124 are formed subsequently. In detail, inside the guard ring pattern 114, the metal residue on the dielectric layer around the sidewall of the electrode pattern 110 may be electronically coupled to the metal residue on the inner side of the dielectric layer of the guard ring pattern 114; however, these two metal residues are only electronically coupled to the interconnect pattern 120 but not to other interconnect patterns. Similarly, inside the guard ring pattern 116, the metal residue on the dielectric layer around the sidewall of the electrode pattern 110 may be electronically coupled to the metal residue on the inner side of the dielectric layer of the guard ring pattern 116; however, these two metal residues are only electronically coupled to the interconnect pattern 122 but not to other interconnect patterns. Also, inside the guard ring pattern 118, the metal residue on the dielectric layer around the sidewall of the electrode pattern 110 may be electronically coupled to the metal residue on the inner side of the dielectric layer of the guard ring pattern 118; however, these two metal residues are only electronically coupled to the interconnect pattern 124 but not to other interconnect patterns.

On the other side, outside the guard ring patterns 114, 116 and 118, the metal residue on the dielectric layer around the sidewall of the electrode pattern 110 may be electronically coupled to the metal residues on the outer side of the dielectric layer of the guard ring patterns 114, 116 and 118; however, these metal residues are not electronically coupled to the interconnect patterns 120, 122, or 124. In summary, the present invention can solve the metal bridge issue caused by metal residues by forming the guard ring patterns 114, 116 and 118.

In the above mentioned embodiment, three guard ring patterns are formed respectively surrounding the three interconnect patterns corresponding to the three electrode patterns. However, in application, the number of the guard ring patterns can be one less than the number of the interconnect patterns. In the above mentioned embodiment, the guard ring patterns can be formed on two of the three interconnect patterns corresponding to the electrode patterns. In one embodiment, referring to FIG. 2B, the guard ring patterns 114 and 116 are formed respectively surrounding the interconnect patterns 120 and 122. In another embodiment, referring to FIG. 2C, the guard ring patterns 114 and 118 are formed respectively surrounding the interconnect patterns 120 and 124. In another embodiment, referring to FIG. 2D, the guard ring patterns 116 and 118 are formed respectively surrounding the interconnect patterns 124 and 124.

Figure 3A:
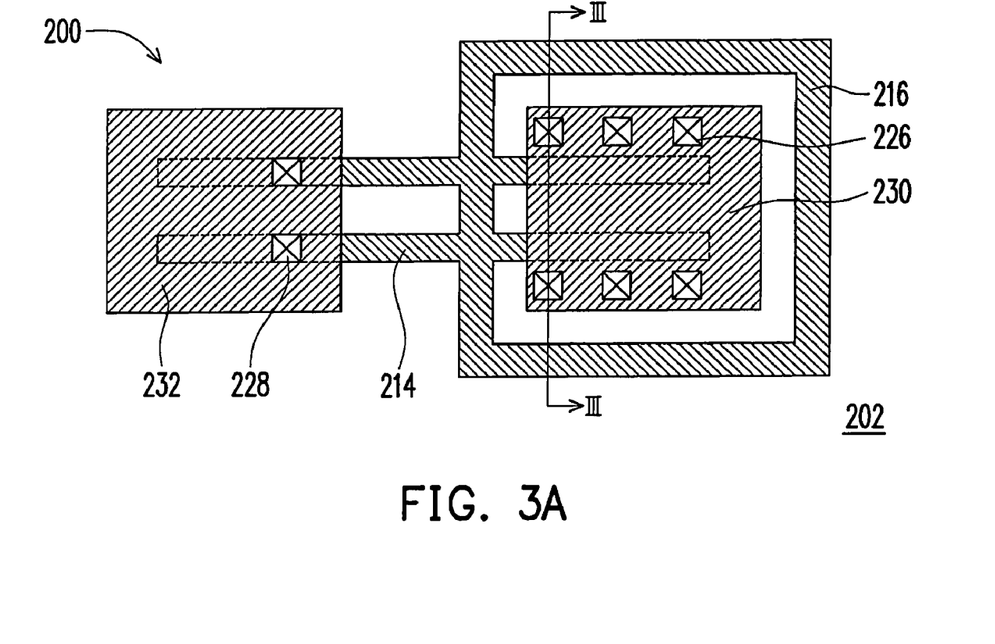
FIGS. 3A, 3B and 3C are schematic top views illustrating a semiconductor device according to another embodiment of this invention.
Figure 3B:
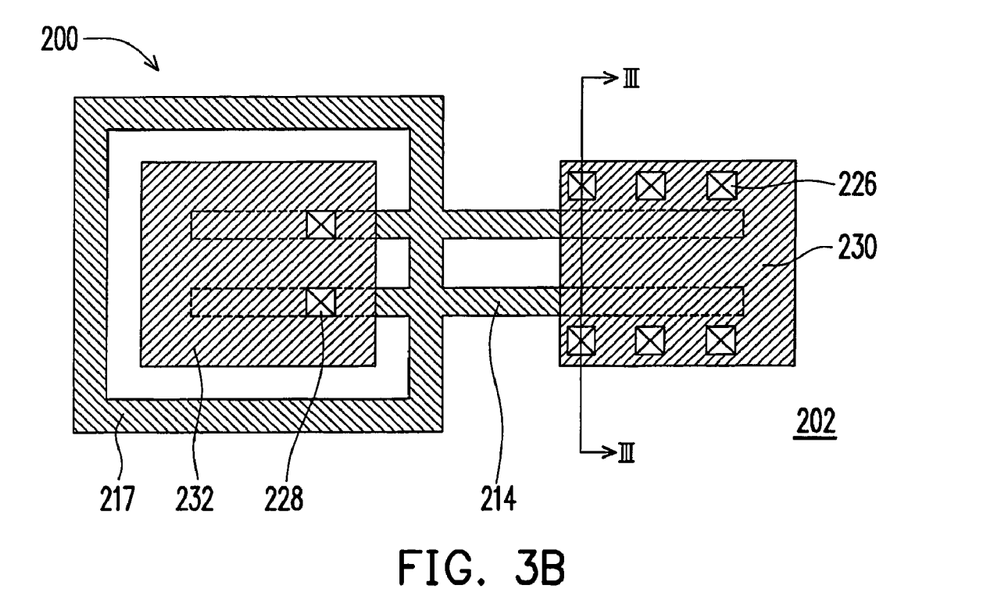
Figure 3C:
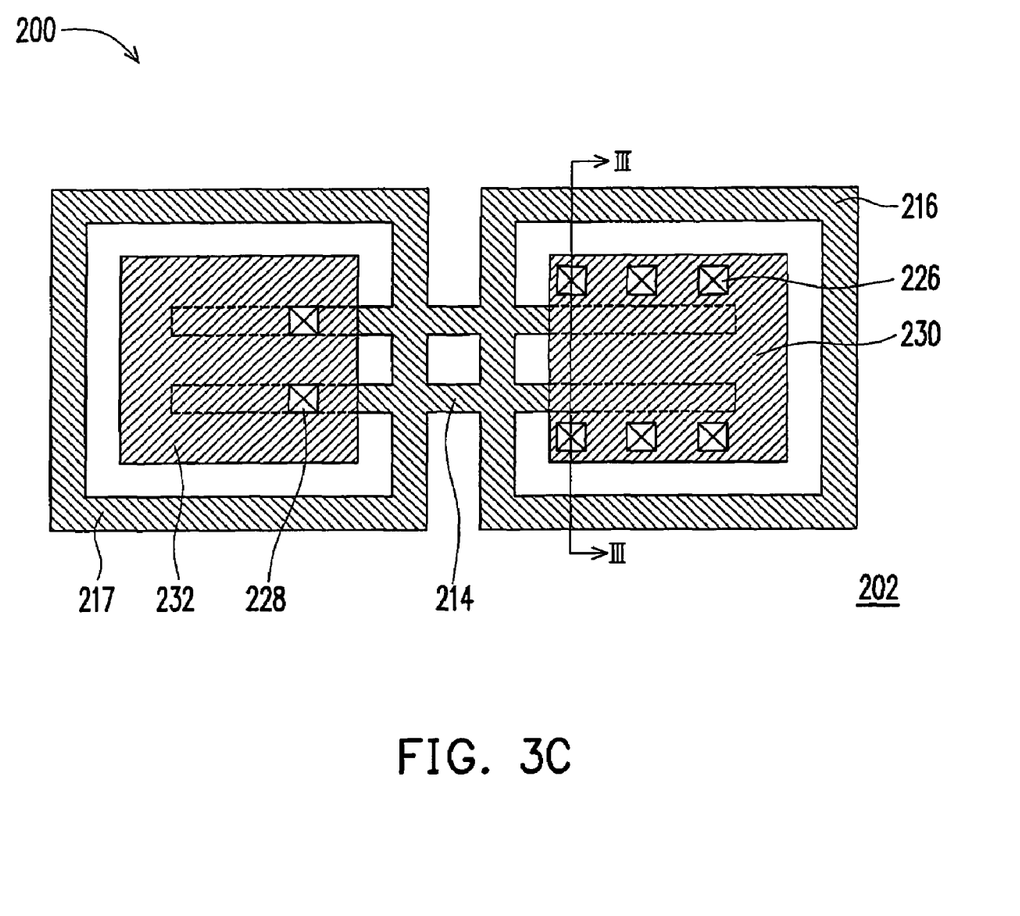
Figure 4A:
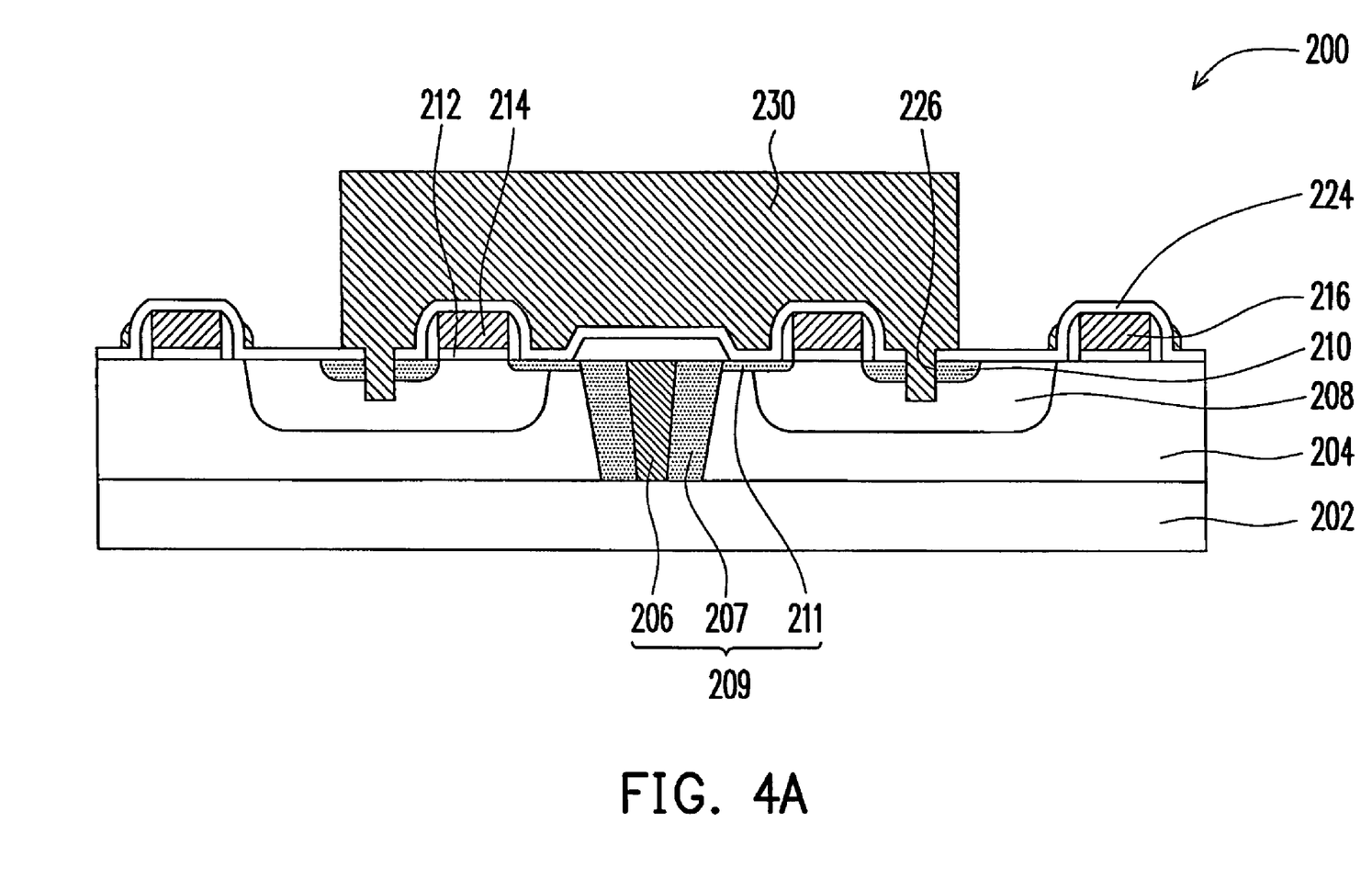
FIGS. 4A, 4B and 4C are schematic cross-sectional views taken along the line III-III of FIGS. 3A, 3B and 3C.
Figure 4B:
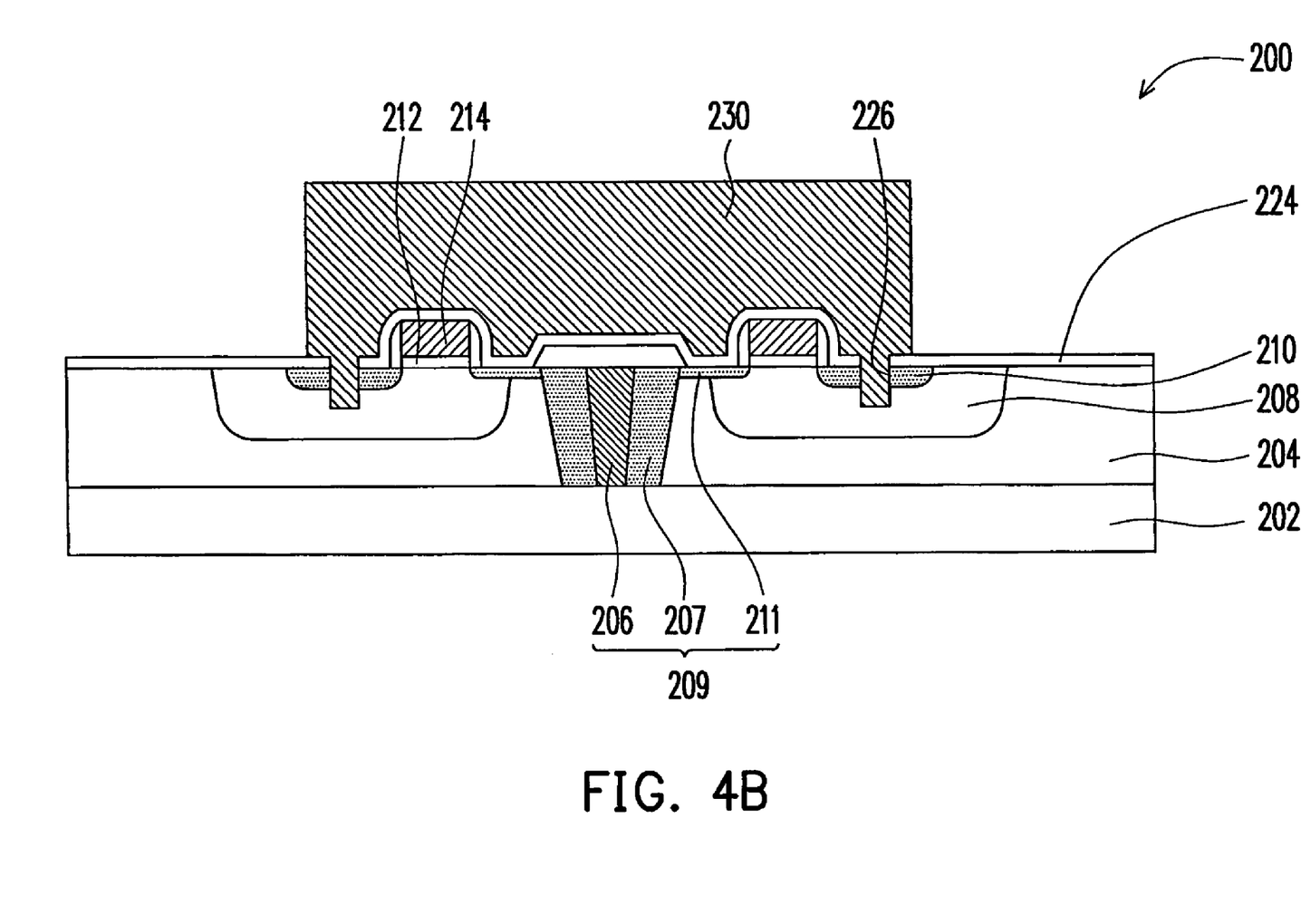
Figure 4C:
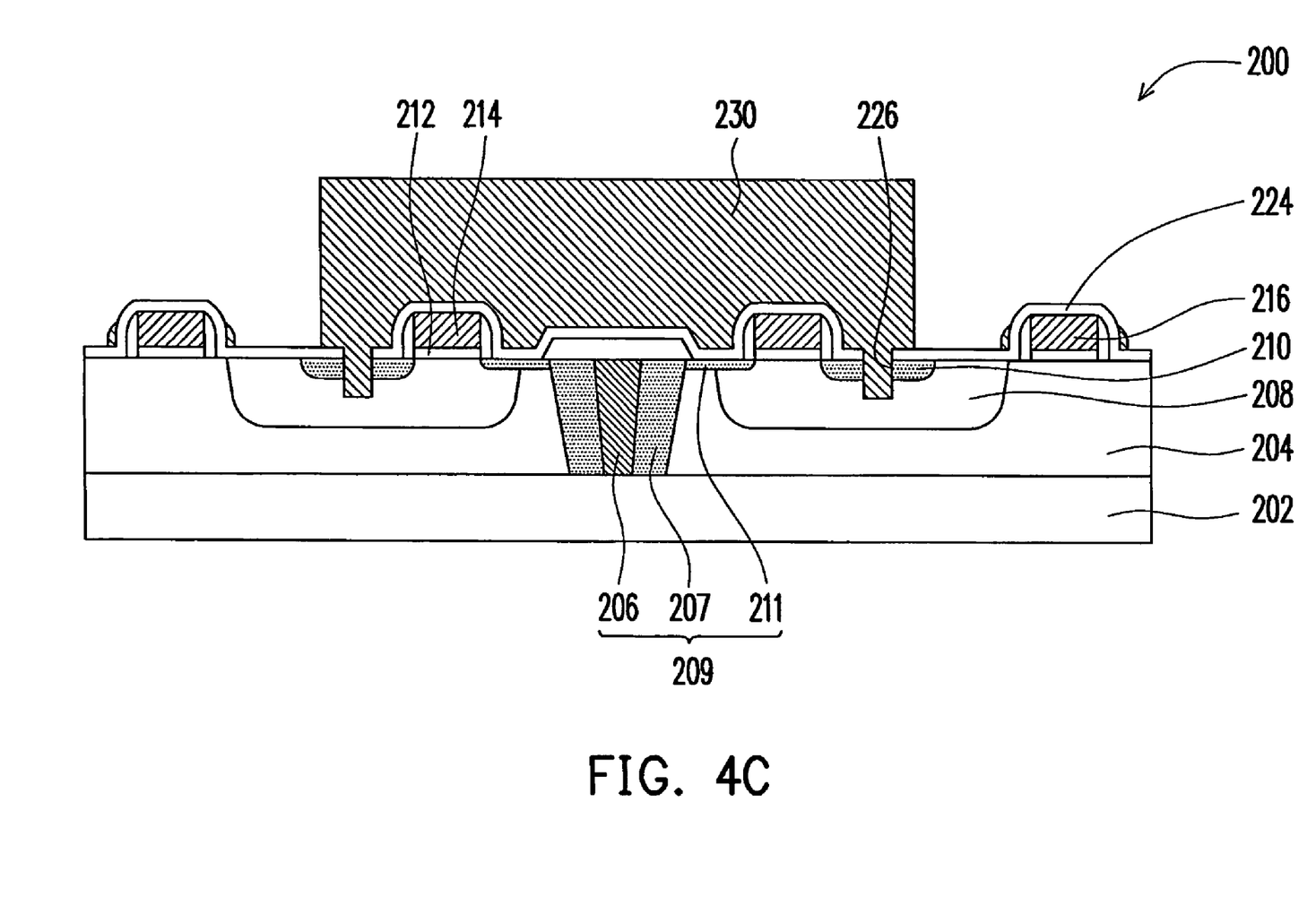

FIGS. 3A, 3B and 3C are schematic top views illustrating a semiconductor device according to another embodiment of this invention. FIGS. 4A, 4B and 4C are schematic cross-sectional views taken along the line III-III of FIGS. 3A, 3B and 3C.

Referring to FIGS. 3A and 4A, a power MOS device 200 is formed on a substrate 202. An N-type epitaxial layer 204 is formed in the substrate 202 and a P-body region 208 is formed in the N-type epitaxial layer 204.

An N-type source doped region 210 is formed in the P-body region 208 at one side of a gate pattern 214. The method of forming the N-type source doped region 210 is an ion implant process, for example. An N-type drain doped region 209 is formed with an N-type doped polysilicon layer 206, N-type diffusion regions 207 and N-type light doped regions 211. The N-type doped polysilicon layer 206 and the N-type diffusion regions 207 are electronically coupled to the substrate 202. The N-type doped polysilicon layer 206 is possibly formed by forming a trench in the N-type epitaxial layer 204 and refilling the trench with N-type doped polysilicon layer, for example. The N-type diffusion regions 207 are formed by a thermal diffusion process of N-type dopants from the N-type doped polysilicon layer 206. The N-type light doped regions 211 are formed by an ion implant process.

An un-planarized dielectric layer 224 is formed conformally over the substrate 202. The thickness of the dielectric layer 224 ranges from 1000 to 3000 angstroms, for example. The material of the dielectric layer 224 is silicon oxide, for example. The method of forming the dielectric layer 224 is a CVD process, for example.

A source metal pattern 230 on the dielectric layer 224 and a gate metal pattern 232 are formed from the same metal layer during a patterning process. The material of the metal layer may include metal, such as aluminum, cupper, AlCu or AlSiCu. The source metal pattern 230 connects to the N-type source doped region 210 and the P-body region 208 via a plurality of contact plugs 226. The gate metal pattern 232 connects to a plurality of gate patterns 214 via a plurality of contact plugs 228.

In this embodiment, the power MOS device 200 also includes a guard ring pattern 216. The guard ring pattern 216 is electronically coupled to the gate patterns 214 and forms a close loop surrounding the source metal pattern 230. The guard ring pattern 216 and the gate patterns 214 are formed from the same conductive layer during a patterning process. The material of the conductive layer is polysilicon or polycide, for example.

The method of forming the guard ring pattern 216 and the gate patterns 214 is first to form a gate dielectric layer and a doped polysilicon layer on the substrate 202, and perform the same photolithography-and-etching process to simultaneously form the guard ring pattern 216 and the virtual gate dielectric pattern thereunder, as well as the gate patterns 214 and the gate dielectric patterns 212 thereunder. The shape or pattern of the guard ring pattern 216 is not limited, as long as the guard ring pattern 216 can constitute a closed loop with the gate patterns 214.

The guard ring pattern 216 connects to the gate patterns 214 and form a closed loop, and thus no metal bridge issue is observed even though metal residues remain on the dielectric layer 224 around the sidewalls of the source metal pattern 230 and the gate metal pattern 232 when the source metal pattern 230 and the gate metal pattern 232 are formed subsequently. In detail, outside the guard ring pattern 216, the metal residues on the dielectric layer 224 around the sidewalls of the gate patterns 214 may be electronically coupled to the metal residue on the outer side of the dielectric layer 224 of the guard ring pattern 216; however, these metal residues are only electronically coupled to the gate metal pattern 232 but not to the source metal pattern 230.

Similarly, inside the guard ring pattern 216, the metal residue on the dielectric layer 224 around the sidewalls of the gate patterns 214 may be electronically coupled to the metal residue on the inner side of the dielectric layer of the guard ring pattern 216; however, these metal residues are only electronically coupled to the source metal pattern 230 but not to the gate metal pattern 232. In other words, the present invention can solve the metal bridge issue caused by metal residues by forming the guard ring pattern 216.

In the above mentioned embodiment, the guard ring pattern 216 is formed surrounding the source metal pattern 230. However, in application, the guard ring pattern 217 can be formed surrounding the gate metal pattern 232 as shown in FIGS. 3B and 4B. In fact, the metal bridge issue can be avoided when the number of the guard ring patterns is one less than the number of the metal patterns. It is for sure that the guard ring patterns 216 and 217 can be formed simultaneously surrounding the source metal pattern 230 and the gate metal pattern 232 if the area of the wafer is allowed, as shown in FIGS. 3C and 4C.

The N-channel power MOS device of the above mentioned embodiment is intended to illustrate and not to limit the present invention. The present invention can be applied to a P-channel power MOS device as well.

In the present invention, a guard ring pattern is configured surrounding an interconnect pattern. The guard ring pattern may have metal residue connecting to the electrode pattern, but the guard ring pattern separates the metal residue inside the guard ring pattern from that outside the guard ring pattern. Therefore, the metal bridge issue caused by metal residues can be resolved when an un-planarized dielectric layer is applied.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor device, comprising:
a plurality of doped regions, disposed in a substrate;
a metal layer, comprising a plurality of metal line patterns;
a polysilicon layer, disposed between the substrate and the metal layer and comprising a gate pattern and at least one guard ring pattern, wherein;
the least one guard ring pattern physically connects to the gate pattern and surrounds at least one of the metal line patterns;
one of the metal line patterns connects to the gate pattern; and
the others of the metal line patterns connect to one of the doped regions in the substrate.

2. The semiconductor device of claim 1, wherein the doped regions comprises a source doped region, a drain doped region or both.

3. The semiconductor device of claim 2, wherein the number of the metal line patterns is N, the number of the guard ring patterns is N–1, the N–1 guard ring patterns surround the N–1 metal line patterns out of the N interconnect patterns respectively, and N is an integral number larger than 1.

4. The semiconductor device of claim 2, wherein the number of the metal line patterns is N, the number of the guard ring patterns is N, the N guard ring patterns surround the N metal line patterns respectively, and N is an integral number larger than 1.

5. The semiconductor device of claim 1, wherein the number of the metal line patterns is N, the number of the guard ring patterns is N–1, the N–1 guard ring patterns surround the N–1 metal line patterns out of the N metal line patterns respectively, and N is an integral number larger than 1.

6. The semiconductor device of claim 1, wherein the number of the metal line patterns is N, the number of the guard ring patterns is N, the N guard ring patterns surround the N metal line patterns respectively, and N is an integral number larger than 1.

7. The semiconductor device of claim 1, further comprising an un-planarized dielectric layer disposed between the metal layer and the polysilicon layer.

8. The semiconductor device of claim 1, wherein the guard ring pattern forms a closed loop with the gate pattern.

9. The semiconductor device of claim 1, wherein the semiconductor device comprises a MOS device.

10. The semiconductor device of claim 1, wherein the semiconductor device comprises a power MOS device.

* * * * *